United States Patent
Higuchi et al.

(10) Patent No.: US 6,930,339 B2
(45) Date of Patent: Aug. 16, 2005

(54) FERROELECTRIC MEMORY AND ELECTRONIC APPARATUS

(75) Inventors: Takamitsu Higuchi, Matsumoto (JP); Setsuya Iwashita, Nirasaki (JP); Hiromu Miyazawa, Toyoshina-machi (JP); Kazumasa Hasegawa, Nagano-ken (JP); Eiji Natori, Chino (JP)

(73) Assignee: Seiko Epson Corporation (JP)

( * ) Notice: Subject to any disclaimer, the term of this patent is extended or adjusted under 35 U.S.C. 154(b) by 52 days.

(21) Appl. No.: 10/105,002

(22) Filed: Mar. 22, 2002

(65) Prior Publication Data

US 2002/0155666 A1 Oct. 24, 2002

(30) Foreign Application Priority Data

Mar. 26, 2001 (JP) .................................. 2001-088844
Mar. 15, 2002 (JP) .................................. 2002-073093

(51) Int. Cl.[7] .......................................... H01L 31/119
(52) U.S. Cl. .................... 257/295; 257/723; 365/145
(58) Field of Search ................................. 257/295, 723, 257/E27.104, 906, 724, 300, 314, 315, 298, 304, 311, 307, 532, 535, 627, 45; 365/145; 438/3

(56) References Cited

U.S. PATENT DOCUMENTS

| | | | |
|---|---|---|---|
| 5,060,191 A | * 10/1991 | Nagasaki et al. | ............ 365/145 |
| 5,545,291 A | 8/1996 | Smith et al. | |
| 5,783,856 A | 7/1998 | Smith et al. | |
| 5,824,186 A | 10/1998 | Smith et al. | |
| 5,889,299 A | * 3/1999 | Abe et al. | .................... 257/295 |
| 5,904,545 A | 5/1999 | Smith et al. | |
| 5,986,298 A | 11/1999 | Yoo | |
| 5,990,564 A | * 11/1999 | Degani et al. | ............... 257/778 |
| 6,005,270 A | * 12/1999 | Noguchi et al. | ............. 257/295 |
| 6,077,716 A | 6/2000 | Yoo | |
| 6,225,656 B1 | * 5/2001 | Cuchiaro et al. | ............ 257/295 |
| 2002/0044480 A1 | * 4/2002 | Gudesen et al. | ............. 365/145 |

FOREIGN PATENT DOCUMENTS

| | | |
|---|---|---|
| JP | 08-273371 | 10/1996 |
| JP | 09-116107 | 5/1997 |
| JP | 09-128960 | 5/1997 |
| JP | 2002-026285 | 1/2002 |

OTHER PUBLICATIONS

Drobac, Stan, "Fluidic Self–Assembly Could Change the Way FPDs Are Made", Information Display, 11/99, pp. 12–16.

* cited by examiner

*Primary Examiner*—Tom Thomas
*Assistant Examiner*—Matthew Landau
(74) *Attorney, Agent, or Firm*—Harness, Dickey & Pierce, P.L.C.

(57) ABSTRACT

The present invention relates to a ferroelectric memory having a matrix-type memory cell array which has a superior degree of integration, in which the angularity of the ferroelectric layer's hysteresis curve is improved, the production yield is increased and costs are reduced.

A ferroelectric memory having improved angularity in the hysteresis curve, and superior memory characteristics, production yield and costs is realized as follows. Namely, a peripheral circuit chip and a memory cell array chip are engaged onto an inexpensive assembly base 300 such as glass or plastic. In memory cell array chip 200, a ferroelectric layer is made to undergo epitaxial growth on to a Si single crystal via a buffer layer and first signal electrode. As a result, a ferroelectric memory can be realized which has improved angularity in the hysteresis curve and superior memory characteristics, production yield, and cost.

18 Claims, 5 Drawing Sheets

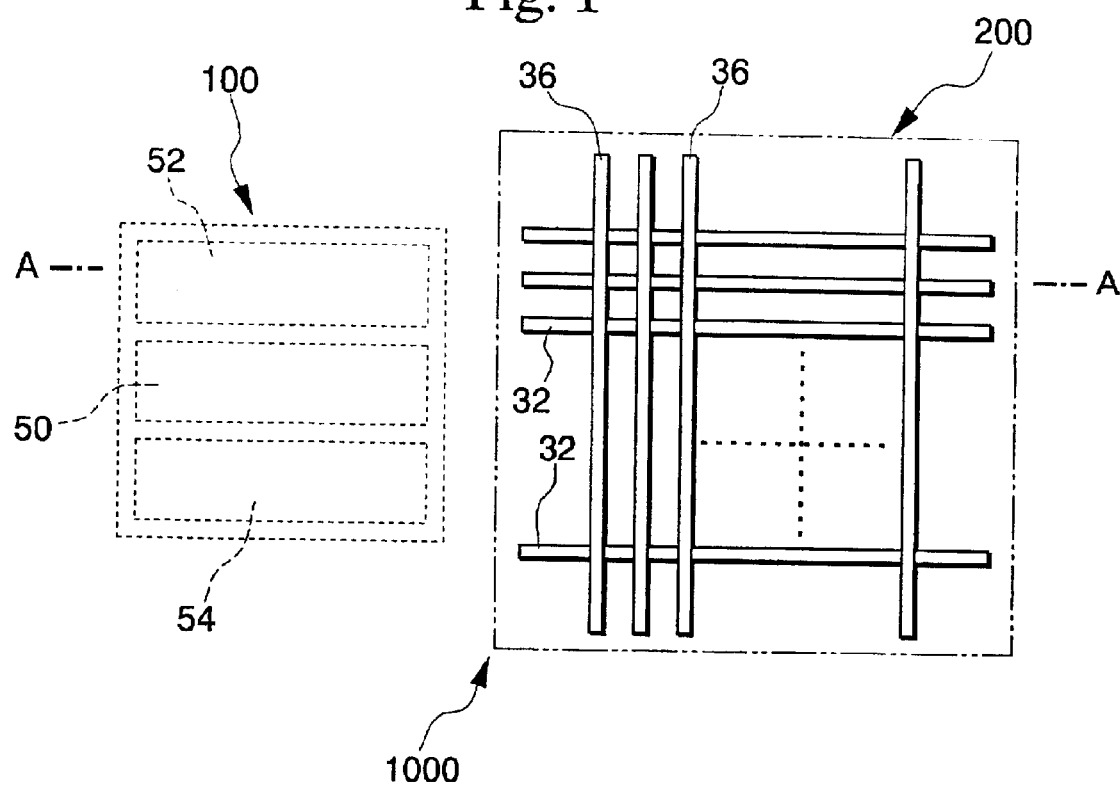
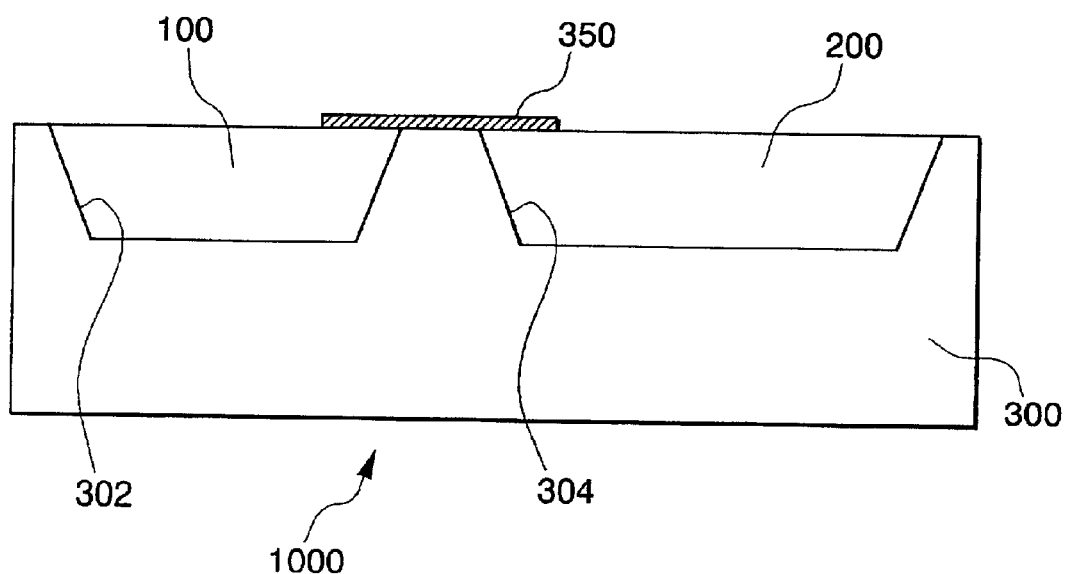

FERROELECTRIC MEMORY AND ELECTRONIC APPARATUS

BACKGROUND OF THE INVENTION

1. Field of the Invention

The present invention relates to a ferroelectric memory, and more specifically to a sample matrix-type ferroelectric memory that uses only a ferroelectric capacitor and does not have a cell transistor. The present invention further relates to an electronic apparatus provided with this ferroelectric memory.

2. Description of Related Art

Ferroelectric memory has undergone rapid development in recent years as a form of nonvolatile memory employing a ferroelectric substance. Typically, a ferroelectric capacitor is formed by employing an oxidized ferroelectric material as the capacitor insulating film, and is used as a non-volatile memory by storing data according to the polarization direction of the ferroelectric capacitor.

In the usual ferroelectric memory, the peripheral circuit for selectively carrying out the writing and reading out of data to and from a memory cell and the memory cell are formed in close proximity to one another. As single cell therefore has a large area, it was difficult to improve the degree of integration in the memory cell and increase the memory capacity.

In order to achieve greater integration and higher capacity, a ferroelectric memory was therefore proposed in which a memory cell array is formed that is composed of first signal electrodes having of stripe-type electrodes which wiring is parallel, second signal electrodes which wiring is in parallel and in a direction which is perpendicular to the direction of the rows of first signal electrodes, and a ferroelectric layer disposed in between the aforementioned first and second signal electrodes at the areas of intersection therebetween, wherein the memory cells in this memory cell array are arranged in the form of a matrix (see Japanese Patent Application, First Publication No. Hei 9-128960).

When a voltage is impressed on a given selected cell in a ferroelectric memory composed of this type of memory cell array, however, a voltage is also impressed on non-selected cells. In order to minimize this effect, a method has been proposed in which a voltage Va is impressed on the selected cell and a voltage Va/3 or −Va/3 is impressed on non-selected cells, this method being accomplished by impressing, for example, a voltage Va on the selected first signal electrode, a voltage Va/3 on the non-selected first signal electrodes, a voltage 0 on the selected second signal electrode, and a voltage 2Va/3 on the non-selected second signal electrodes (see Japanese Patent Application, First Publication No. Hei 9-128960). Accordingly, a domain inversion must occur at Va but must not occur at Va/3 in the ferroelectric layer. In other words, the polarization-electric field (P-E) hysteresis curve must have angularity.

In the usual structure of ferroelectric memory, the memory cell portion is formed on top of a $SiO_2$ protecting layer that is formed on the peripheral circuit that contains the MOS transistor. It is therefore not possible to control the orientation of the ferroelectric layer, and so, the angles that are formed by the impressed electric fields and the polarization axes of each crystal grain vary from one another. As a result, variation also arises in the voltage impressed when each crystal grain undergoes domain inversion, which leads to problematic deterioration in the angularity of the hysteresis curve.

BRIEF SUMMARY OF THE INVENTION

Hereafter, also in the embodiments and claims, numerals accompanied by the parenthesis like (010) or (100) indicate the condition of orientation such as disposing direction of the single crystal or the like.

It is therefore the objective of the present invention to provide a ferroelectric memory that has a hysteresis curve with improved angularity, excellent cost, and superior integration and memory characteristics, these objectives being accomplished by separately producing a memory cell array chip in which the memory cell array has been made to undergo epitaxial growth on a Si single crystal, and then engaging this memory cell array chip in an inexpensive assembly base. It is a further objective of the present invention to provide an electronic device provided with this ferroelectric memory.

The ferroelectric memory is characterized in that:

a memory cell array and a peripheral circuit are included on an assembly base composed of one of either semiconductor, glass or plastic, the memory cell array consisting of first signal electrodes and second signal electrodes disposed facing and perpendicular to each other, and a ferroelectric layer held in between the first signal electrodes and the second signal electrodes, wherein the regions of intersection between the first signal electrodes and the second signal electrodes that include the ferroelectric layer are disposed in the form of a matrix for employment as memory cells, and the peripheral circuit including MOS transistors for selecting the memory cells; and the memory cell array and the peripheral circuit are constructed such that memory cell array chips and peripheral circuit chips that are formed on separate chips are layered onto the assembly base;

wherein, in the memory cell array chip, the first signal electrode undergoes epitaxial growth on a Si single crystal substrate via a buffer layer, and the ferroelectric layer undergoes epitaxial growth on the first signal electrode.

As a result of the above structure, it is possible to form and optionally dispose a memory cell array that has a ferroelectric layer in which the angularity of the hysteresis curve has been improved due to epitaxial growth onto an inexpensive mounting base such as a semiconductor, glass, or plastic. Thus, a ferroelectric memory can be realized at low cost that has both a high degree of integration and superior memory characteristics.

The ferroelectric memory is characterized in that the ferroelectric layer is composed of an oxidized ferroelectric material having a perovskite structure, or an oxidized ferroelectric material having a Bi layered perovskite structure.

The above structure is effective in obtaining a ferroelectric memory provided with both integration and memory characteristics by employing an oxidized ferroelectric material having a perovskite structure or an oxidized ferroelectric material having a Bi layered perovskite structure, by means of which impressive developments in memory characteristics have been achieved in recent years.

The ferroelectric memory is characterized in that the Si single crystal substrate is a (100) substrate; the buffer layer includes one of either titanium nitride (TiN) or a metal oxide MO (M=Mg, Ca, Sr, Ba) which has a NaCl structure and (100)-oriented or (110)-oriented in cubic system metal platinum Pt which is (100)-oriented in cubic system or a conductive oxide which has a perovskite structure and are (100)-oriented in cubic system or (100)-oriented in pseudo-cubic system.

By making the first signal electrode which is (100)-oriented in cubic system or in pseudo-cubic system undergo epitaxial growth on the (100) Si single crystal substrate, the above design has the effect of causing the ferroelectric layer to undergo epitaxial growth on to the first signal electrodes.

The ferroelectric memory is characterized in that the ferroelectric layer has a polarization moment in the tetragonal (001) direction, and is composed of an oxidized ferroelectric material having a (001)-oriented perovskite structure.

By means of the above structure, a ferroelectric layer containing a representative ferroelectric substance, PZT ($PbZr_xTi_{1-x}O_3$), can be made to undergo epitaxial growth at a tetragonal (001) orientation on a (100) Si single crystal substrate, which has the effect of providing a ferroelectric memory having good angularity.

The ferroelectric memory is characterized in that the Si single crystal substrate is a (110) substrate; the buffer layer includes one of either titanium nitride (TiN) or a metal oxide MO (M=Mg, Ca, Sr, Ba) which has a NaCl structure and are (110)-oriented in cubic system; and the first signal electrodes include one of either a metal platinum Pt which is (110)-oriented in cubic system or a conductive oxide which has a perovskite structure and is (110)-oriented in pseudo-cubic system.

By causing the first signal electrodes which is (110)-oriented in cubic system or in pseudo-cubic systemto undergo epitaxial growth on the (110) Si single crystal substrate, the above design has the effect of causing the ferroelectric layer to undergo epitaxial growth on to the first signal electrodes.

The ferroelectric memory is characterized in that the ferroelectric layer is composed of a oxidized ferroelectric material having a Bi layered perovskite structure that has a polarization moment in the a or b axis direction in a tetragonal or orthorhombic.

By means of the above structure, a ferroelectric layer containing a representative ferroelectric substance SBT ($SrBi_2Ta_2O_9$) can be made to undergo epitaxial growth on a (110) Si single crystal substrate, which has the effect of providing a ferroelectric memory having good angularity.

The ferroelectric memory is characterized in that the Si single crystal substrate is a (111) substrate; the buffer layer includes one of either titanium nitride (TiN) or a metal oxide MO (M=Mg, Ca, Sr, Ba) which has a NaCl structure and is (111)-oriented in cubic system; and the first signal electrode includes one of either a metal platinum Pt which is (111)-oriented in cubic system or a conductive oxide which has a perovskite structure and is (111)-oriented in cubic system or (111)-oriented in pseudo-cubic system.

By making first signal electrodes which is (111)-oriented in cubic system or in pseudo-cubic undergo epitaxial growth on the (111(Si single crystal substrate, the above design has the effect of causing the ferroelectric layer to undergo epitaxial growth on to the first signal electrodes.

The ferroelectric memory is characterized in that the ferroelectric layer is composed of an oxidized ferroelectric material having a polarization moment in the (111) direction in the rhombohedral system and a (111)-oriented perovskite structure, or an oxidized ferroelectric material having a Bi layered perovskite structure which has a polarization moment in the a or b axis direction in a tetragonal or orthorhombic system.

By means of the above design, a ferroelectric layer containing a representative ferroelectric substance PZT ($PbZr_xTi_{1-x}O_3$) or SBT ($SrBi_2Ta_2O_9$) can be made to undergo epitaxial growth on a (111) Si single crystal substrate, which has the effect of providing a ferroelectric memory having good angularity.

The ferroelectric memory of the present invention is characterized in that the Si single crystal substrate is a (100) substrate, the buffer layer includes at least one of a cerium oxide $CeO_2$ or yttrium stabilized zirconia YSZ having a fluorite structure and are (100)-oriented in cubic system, and the first signal electrodes include at least one of a metal platinum Pt which is (110)-oriented in cubic system or a conductive oxide having a perovskite structure and are (110)-oriented in cubic system or (110)-oriented in pseudo-cubic system.

By causing cubic or pseudo-cubic (110)-oriented first signal electrodes to undergo epitaxial growth on the (100) Si single crystal substrate, the above design is effective in causing the ferroelectric layer to undergo epitaxial growth on top of the first signal electrodes.

The ferroelectric memory is characterized in that the ferroelectric layer is composed of an oxidized ferroelectric material having a Bi layered perovskite structure which has a polarization moment in the a axis or the b axis direction in a tetragonal or orthorhombic.

By means of the above design, it is possible to cause a ferroelectric layer containing a representative ferroelectric substance, SBT ($SrBi_2Ta_2O_9$), to undergo epitaxial growth on a (100) Si single crystal substrate, which is effective in obtaining a ferroelectric memory having good angularity.

The electronic apparatus is characterized in the provision of including a ferroelectric memory according each of the above embodiments.

By providing a ferroelectric memory which is low in cost and has both integration and memory characteristics in the above design, it is possible to provide an electronic apparatus which is highly reliable, inexpensive and small in size.

BRIEF DESCRIPTION OF THE DRAWINGS

FIG. 1 is a plan view schematically showing the ferroelectric memory according to the first embodiment of the present invention.

FIG. 2 is a cross section schematically showing the portion of the ferroelectric memory along the line A—A in FIG. 1.

FIG. 8 is a view showing examples of electronic apparatuses equipped with a ferroelectric memory.

DETAILED DESCRIPTION OF THE INVENTION

Preferred embodiments of the present invention will now be explained based on the accompanying drawings.

First Embodiment
(Device)

FIG. 1 is a plan view schematically showing the ferroelectric memory according to the present embodiment. FIG. 2 is a cross section schematically showing the portion of the ferroelectric memory along the line A—A indicated in FIG. 1.

Figure 3:
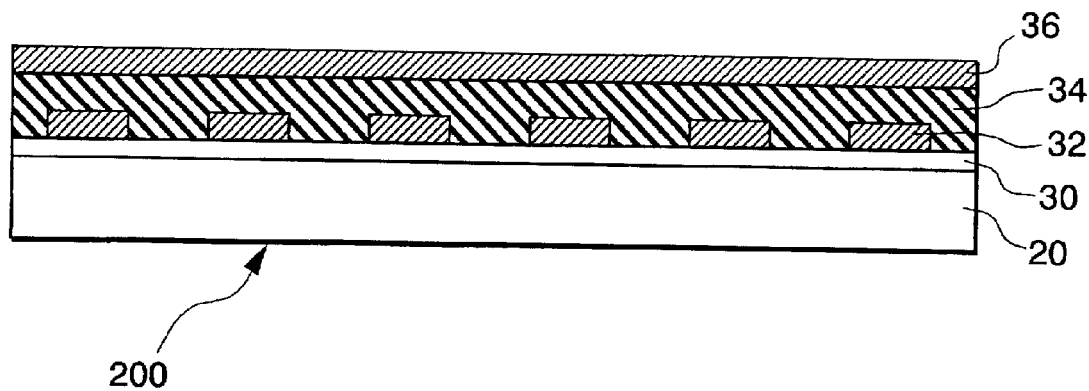
FIG. 3 is a cross section showing an essential component of the memory cell array chip of the ferroelectric memory shown in FIG. 1.
Figure 4:
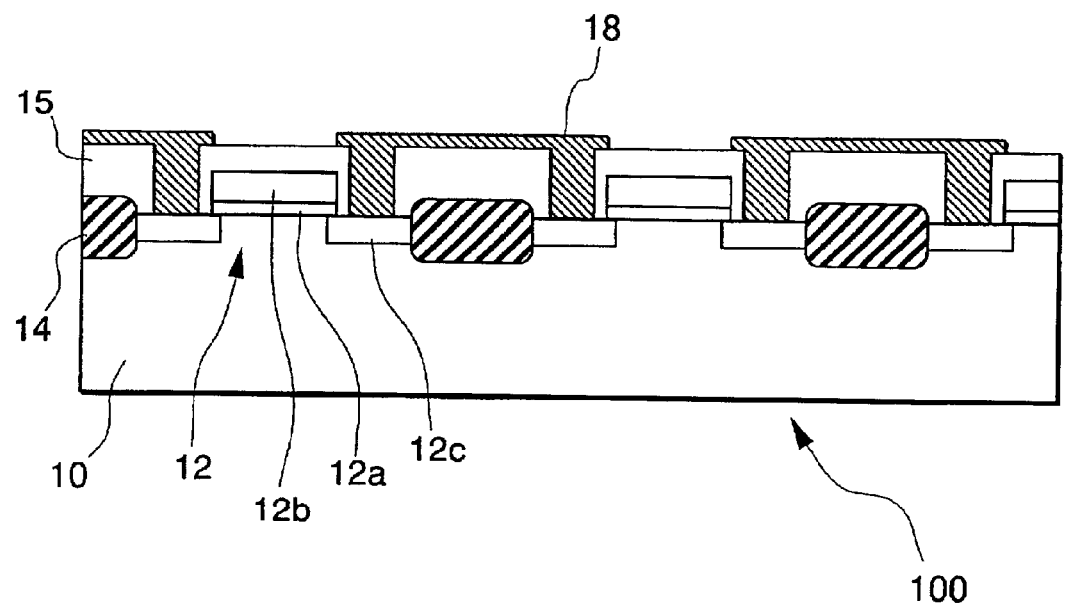
FIG. 4 is a cross section showing the structure of the peripheral circuit chip of the ferroelectric memory shown in FIG. 1.

FIG. 3 is a cross section showing an essential portion of the memory cell array chip of the ferroelectric memory shown in FIG. 1. FIG. 4 is a cross-sectional view showing the structure of the peripheral chip of the ferroelectric memory shown in FIG. 1.

As shown in FIG. 1, the peripheral circuit and the memory cell array are formed to separate chips in ferroelectric memory 1000 according to the present embodiment. In other words, as shown in FIG. 2, in this ferroelectric memory 1000, peripheral circuit chip 100 and memory cell array chip 200 separately engage in concavity 302 and concavity 304 which are formed at specific sites in assembly base 300.

In memory cell array chip 200, as shown in FIG. 3, a buffer layer 30 is formed by epitaxial growth onto a Si single crystal substrate 20. Forming buffer layer 30 facilitates the epitaxial growth of first signal electrode (word line) 32 and ferroelectric layer 34. First signal electrode 32 is formed with a specific pattern by epitaxial growth on buffer layer 30. Ferroelectric layer 34 is formed by epitaxial growth on to buffer layer 30 on which first signal electrode 32 is formed. Second signal electrode (bit line) 36 is formed with a predetermined pattern on to ferroelectric layer 34. Memory cells consisting of respective ferroelectric capacitors are formed at the regions of intersection between first signal electrodes 32 and second signal electrodes 36. Although not shown in the drawings, a protecting layer is suitably formed on to the top layer. The signal electrodes may be reversed from the situation described above, i.e., it is also acceptable for first signal electrode to be the bit line and second signal electrode to be the word line.

MO (M=Mg, Ca, Sr, Ba), TiN, YSZ, and $CeO_2$ may be cited as examples of the material employed for buffer layer 30. Buffer layer 30 may be a signal layer or may be multiple layers in a layered structure. A conventionally known method typically used for epitaxial growth, such as laser ablation, MOCVD, molecular beam epitaxy or the like, may be employed as the film forming method.

$MRuO_3$ (M=Ca, Sr, Ba), $La_{1-x}Sr_xVO_3$, $La_{1-x}Sr_xMnO_3$, $La_{1-x}Sr_xCoO_3$ or Pt may be cited as examples of material which may be used for first signal electrodes 32. First signal electrode 32 may be a signal layer or may be multiple layers in a layered construction. A conventionally known method typically used for epitaxial growth, such as laser abrasion, MOCVD, molecular beam epitaxy or the like, may be employed as the film forming method.

PZT ($PbZr_xTi_{1-x}O_3$) and SBT ($SrBi_2Ta_2O_9$) may be cited as examples of the material for ferroelectric layer 34. A conventionally known method typically used for epitaxial growth, such as laser ablation, MOCVD, molecular beam epitaxy or the like may be employed as the film forming method.

The material employed for second signal electrodes 36 is not particularly restricted, with Ir, $IrO_x$, Ru, and $RuO_x$ being cited as examples in addition to those materials already mentioned for first signal electrodes 32. Second signal electrode 36 may be a signal layer or may be multiple layers in a laminate construction.

Peripheral circuit chip 100 contains all types of circuits necessary for selectively carrying out data write or read operations to and from the memory cells of memory cell array chip 200. Peripheral circuit chip 100 includes, for example, a first drive circuit 50 for selectively controlling first signal electrodes 32, second drive circuit 52 for selectively controlling second signal electrodes 36, and a signal detection circuit 54 such as a sense amp or the like.

As shown in FIG. 4, peripheral circuit chip 100 includes MOS transistors 12 which are formed on Si single crystal substrate 10. MOS transistor 12 has a gate insulating film 12a, gate electrode 12b, and source/drain region 12c. Each MOS transistor 12 is separated by an element separating region 14. Interlayer insulating layer 16 is formed to Si single crystal substrate 10 on which MOS transistor 12 is formed. In addition, each MOS transistor 12 is electrically connected by wiring layer 18 which is formed with a predetermined pattern.

A conventionally known assembly method can be employed in this embodiment as the method for assembling peripheral circuit chip 100 and memory cell array chip 200 to respective concavities 310 in an mounting substrate 300 such as shown in FIG. 2. This conventionally known mounting method will now be explained below.

This mounting method is referred to as a FSA (Fluidic Self Assembly) method. In a FSA method, electronic devices (hereinafter referred to as a "function devices") having a predetermined shape and size on the order of ten to several hundred microns are dispersed in a liquid. This dispersion liquid is made to flow over the surface of a substrate (corresponding to assembly base 300) containing engaging portions (corresponding to concavities 310) or holes that are roughly the same size and shape as those of the function devices. By engaging the function devices in the holes or engaging portions, the function devices are assembled on the base. This FSA method is disclosed, for example, in the publication *Information Display* (S. Drobac, Information Display, Vol. 11 (1999), pp. 12~16), U.S. Pat. No. 5,545,291, U.S. Pat. No. 5,783,856, U.S. Pat. No. 5,824,186, and U.S. Pat. No. 5,904,545, among other sources.

Next, a brief explanation will be composed of an example of the process for mounting a semiconductor device employing the FSA method.

(1) A wafer consisting of single crystal Si and containing several hundred to several million electronic devices is separated into several thousand to several million functional blocks using etching. The functional blocks obtained by this separation have a specific three dimensional shape, with each block has specific functions. In addition, the electronic devices may have a simple structure such as a transistor, or may have a complicated structure such as an IC.

(2) A base for mounting these functional blocks is formed in a separate process. Engraving, etching, a laser or the like is employed to form holes in this base for engaging the functional blocks. These holes are formed to have the same shape and size as the functional blocks.

(3) Next, the functional blocks formed in the above-described process are dispersed in a liquid, and this dispersed liquid is made to flow over the surface of the base formed by the process described under (2) above. In this process, the functional blocks drop into the holes formed in the base as they are passing over the surface of the base, self-align and engage in the holes. Those functional blocks which do not engage in a hole are recovered from the dispersion liquid and cleaned. These functional blocks are then dispersed again in the liquid, which has undergone the same cleaning, and made to flow over the surface of a new base. The functional blocks and the dispersion liquid continue to be reutilized while the preceding process is carried out repeatedly.

(4) The functional blocks that engage in the holes that are formed in the base are electrically wired using the usual metalizing method, and function as part of the electric circuit that is ultimately formed. As a result of the preceding process, the functional blocks are mounted in a semiconductor device.

Since a large amount of functional blocks can be assembled on the base at one time using this FSA method, the cost of devices such as displays can be reduced and production speed can be increased. Moreover, since only a good product which passed an inspection can be used as functional block, the reliability of the device can be increased. A variety of materials such as glass, plastic, or Si can be used as the base for engaging the functional blocks, with the selection of this material being freely made. Similarly, the material used in the functional block may be selected to suit the functions required of the functional block, with examples including Si, GeSi, GaAs, InP and the like. Thus, as an example of an electronic device mounting method, excellent actions and effects can be anticipated with this FSA method.

Here, regarding the orientation direction of Si single crystal substrate 10, buffer layer 30, first signal electrode 32, ferroelectric layer 34, when Si single crystal substrate 10 is a substrate (100), and the buffer layer 30 includes MO (M=Mg, CA, Sr, Ba) or TiN which is (100)-oriented in cubic system, the first signal electrode 32 is (110)-oriented in cubic system or (100)-oriented in pseudo-cubic system, and the ferroelectric layer 34 such as PZT is for example (001)-oriented in tetragonal system. Also, when Si single crystal substrate 10 is a substrate (110), and the buffer layer 30 includes MO (M=Mg, CA, Sr, Ba) or TiN which is (110)-oriented in cubic system, the first signal electrode 32 is oriented in cubic system or (110)-oriented in pseudo-cubic system, and the ferroelectric layer 34 such as SBT is for example (116)-oriented in orthorhombic system. Also, when Si single crystal substrate 10 is substrate (111), and the buffer layer 30 includes MO (M=Mg, CA, Sr, Ba) or TiN which is (111)-oriented in cubic system, the first signal electrode 32 is oriented in cubic system or (111)-oriented in pseudo-cubic system, and the ferroelectric layer 34 such as PZT is for example (111)-oriented in rhombohedral system, or the ferroelectric layer 34 such as SBT is (103)-oriented in orthorhombic system. Also, when Si single crystal substrate 10 is a substrate (100), and the buffer layer 30 includes YSZ or CeO2 which is (100)-oriented in cubic system, the first signal electrode 32 is (110)-oriented in cubic system or (110)-oriented in pseudo-cubic system, and the ferroelectric layer 34 such as SBT is for example (116)-oriented in orthorhombic system.

(Manufacturing Method of Device)

Ferroelectric memory 1000 according to this embodiment can be manufactured using the above-described conventionally known FSA method. Specifically, the FSA method is used to engage memory cell array chip 200 in the bottom of concavity 304 in mounting base 300. At this time, if size and shape are varied between memory cell array chip 200 and peripheral circuit 100, then memory cell array chip 200 will not engage in concavity 302, but rather, will selectively engage in concavity 304. Next, the FSA method is employed to engage peripheral circuit 100 in the bottom concavity 302 of assembly base 300. A connective wiring layer 350 having a specific pattern is then formed along the surface of peripheral circuit chip 100, memory cell array chip 200, and the surface of mounting base 300.

In a ferroelectric memory having the above-described structure, the peripheral circuit and the memory cell array can be formed with separate chips, so that it is possible to entirely separate the two manufacturing processes. As a result, manufacturing processes which are appropriate to the respective chips for the peripheral circuit and the memory cell array can be employed. Specifically, it is often the case that a high process temperature is required to cause epitaxial growth of the ferroelectric layer in the memory cell array chip. For example, when SBT ($SrBi_2Ta_2O_9$) is employed as the ferroelectric layer, the base must be heated to a high temperature in excess of 800° C. In the case of a ferroelectric memory having the design described above, however, no damage is caused to the peripheral circuit, a memory cell array can be mounted that has a ferroelectric layer with superior angularity in its hysteresis curve, and a memory device can be formed with high performance and high yield. In addition, by selecting a material such as glass or plastic for the assembly base, the cost of the memory device can be reduced.

Second Embodiment

Figure 5:
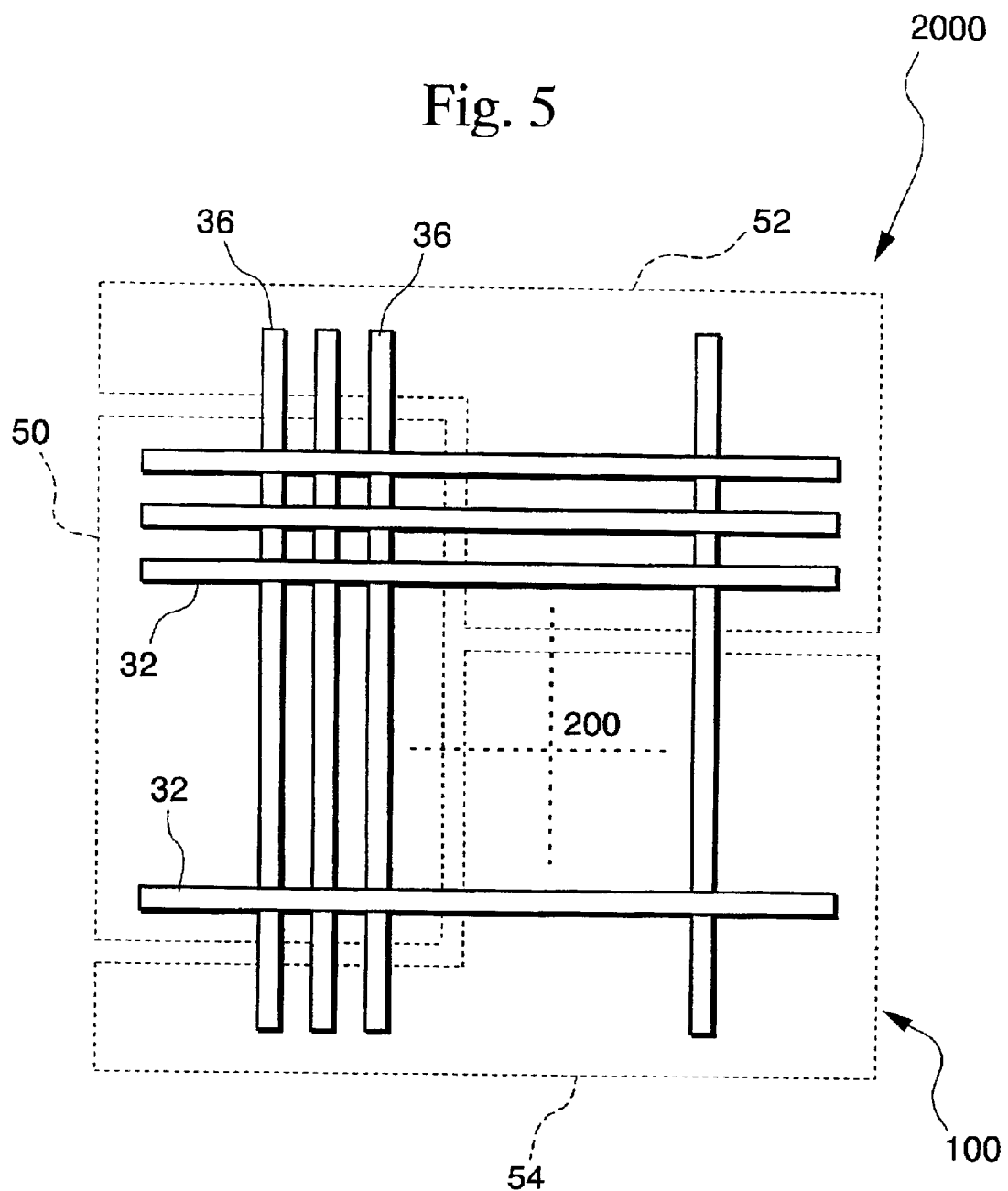
FIG. 5 is a plan view schematically showing the ferroelectric memory according to the second embodiment of the present invention.
Figure 6:
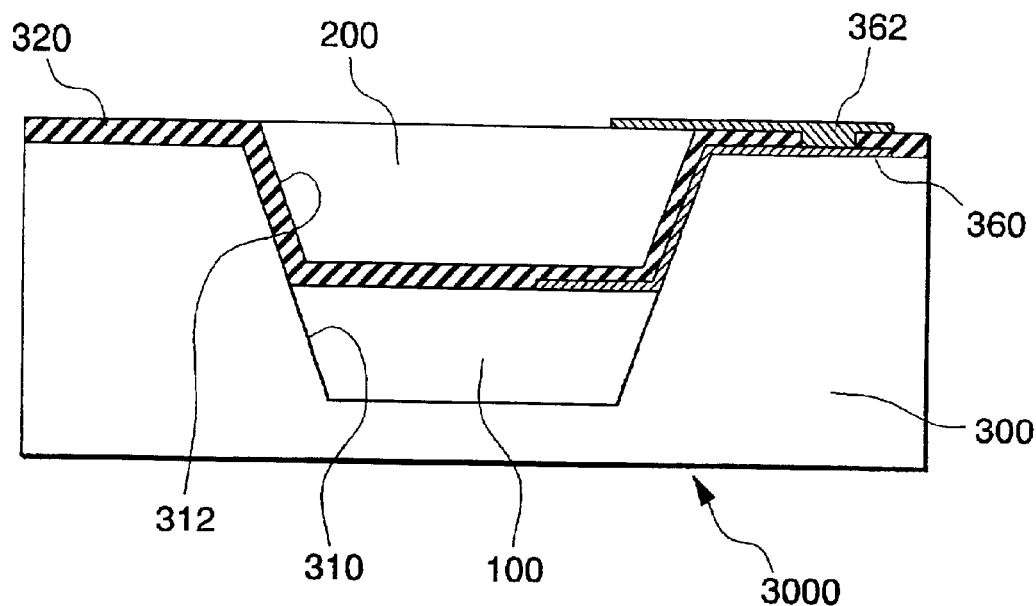
FIG. 6 is a cross section schematically showing the ferroelectric memory shown in FIG. 5.

FIG. 5 is a plan view schematically showing the ferroelectric memory according to the present embodiment. FIG. 6 is a cross section schematically showing the ferroelectric memory shown in FIG. 5.

In ferroelectric memory 2000 according to the present embodiment, peripheral circuit chip 100 and memory cell array chip 200 are laminated and engaged in this state in concavity 310 that is formed at a specific position in mounting base 300.

Ferroelectric memory 2000 according to this embodiment can be formed using the conventionally known FSA method discussed above. Specifically, a FSA method is employed to engage peripheral circuit 100 in the bottom of concavity 310 of assembly base 300. Next, a first connective wiring layer 360 having a specific pattern is formed along the surface of peripheral circuit chip 100 and assembly base 300. Next, an insulating layer 320 is formed that also functions as a flattening layer. A FSA method is then used to engage memory cell array chip 200 inside upper concavity 312 which is formed by the walls of insulating layer 320. A second connective wiring layer 362 is formed for connecting first connective wiring layer 360 and memory cell array chip 200.

In a ferroelectric memory having the above-described structure, it is possible to form a memory cell array with high performance and high yield that has a ferroelectric layer which has superior angularity in its hysteresis curve. In addition to reducing the cost of the memory device by using materials such as glass or plastic for the mounting base, it is also possible to further improve the memory cell's degree of integration by laminating the peripheral circuit and the memory cell array.

Third Embodiment

Figure 7:
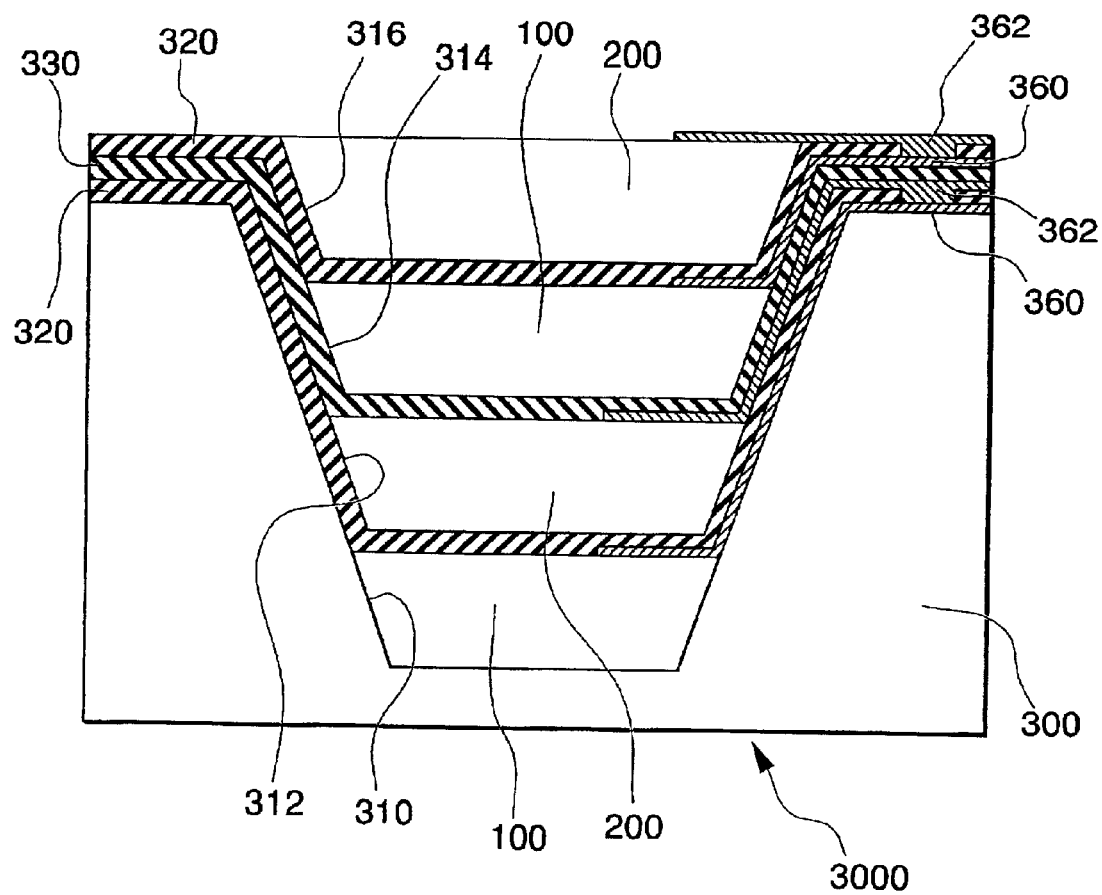
FIG. 7 is a cross section view schematically showing a ferroelectric memory according to a third embodiment of the present invention.

FIG. 7 is a cross section schematically showing the ferroelectric memory according to this embodiment.

Ferroelectric memory 3000 according to this embodiment has a structure in which a plurality of peripheral circuit chips 100 and memory cell array chips 200 are alternately layered inside concavity 310 that is formed in mounting base 300.

A conventionally known FSA method can be employed to form ferroelectric memory 3000 according to this embodiment. Specifically, a FSA method is employed to engage a peripheral circuit 100 in the bottom of concavity 310 in assembly base 300. Next, a first connective wiring layer 360 having a specific pattern is formed along the surface of peripheral circuit chip 100 and mounting base 300. Next, an insulating layer 320 is formed that also functions as a planarizing layer. A FSA method is then used to engage a memory cell array chip 200 inside upper concavity 312 which is formed by the walls of insulating layer 320. A second connective wiring layer 362 is formed for connecting first connective wiring layer 360 and memory cell array chip 200. Insulating layer 330 is formed next. Next, a FSA method is employed to engage peripheral circuit chip 100 in upper concavity 314 formed by the walls of insulating layer 330. A first connective wiring layer 360 having a specific pattern is formed along the surface of peripheral circuit chip 100 and insulating layer 330. Insulating layer 320 is formed next. A FSA method is then used to engage memory cell array chip 200 inside upper concavity 316 formed by the walls of insulating layer 320. A second connective wiring layer 362 is formed for connecting first connective wiring layer 360 and memory cell array chip 200. Thereafter, the process from formation of insulating layer 330 through the formation of second connective wiring layer 362 is repeated, to form a multiple layer in which peripheral circuit chip 100 and memory cell array chip 200 are alternated.

In a ferroelectric memory having the above-described design, it is possible to form a memory cell array with high performance and high yield that has a ferroelectric layer which has superior angularity in its hysteresis curve. In addition to reducing the cost of the memory device by using materials such as glass or plastic for the mounting base, it is also possible to greatly improve the memory cell's degree of integration by alternately layering the peripheral circuits and the memory cell arrays.

Next, an example of an electronic apparatus employing a ferroelectric memory according to the above embodiment will be explained.

Figure 8A:
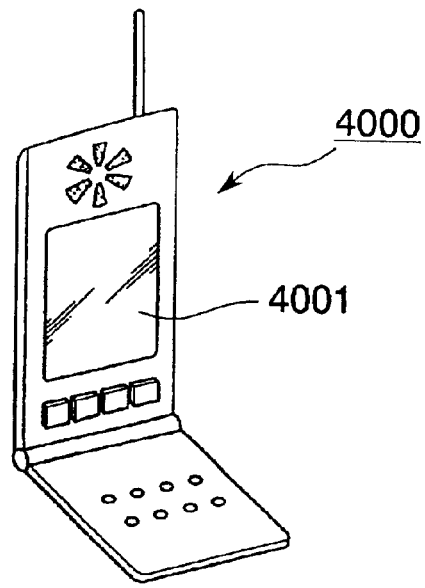
FIGS. 8A, 8B and 8C are perspective views of a cellular telephone, a wristwatch type electronic apparatus and a portable information processing device, respectively.

FIG. 8A is a perspective view showing an example of a cellular telephone. In FIG. 8A, the reference numeral 4000 indicates the main body of a cellular telephone. Memory portion 4001 which employs the above-described ferroelectric memory is provided inside cellular telephone 4000.

Figure 8B:
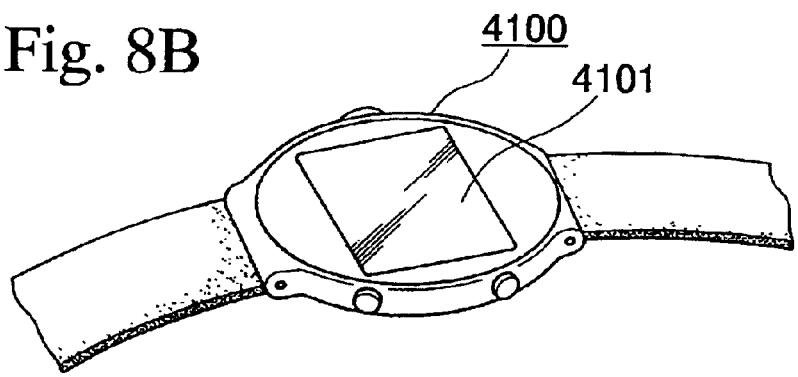

FIG. 8B is a perspective view showing an example of a wristwatch type electronic apparatus. In FIG. 8B, the reference numeral 4100 indicates the main body of a wristwatch. Memory portion 4101 which employs the above-described ferroelectric memory is provided inside wristwatch 4100.

Figure 8C:
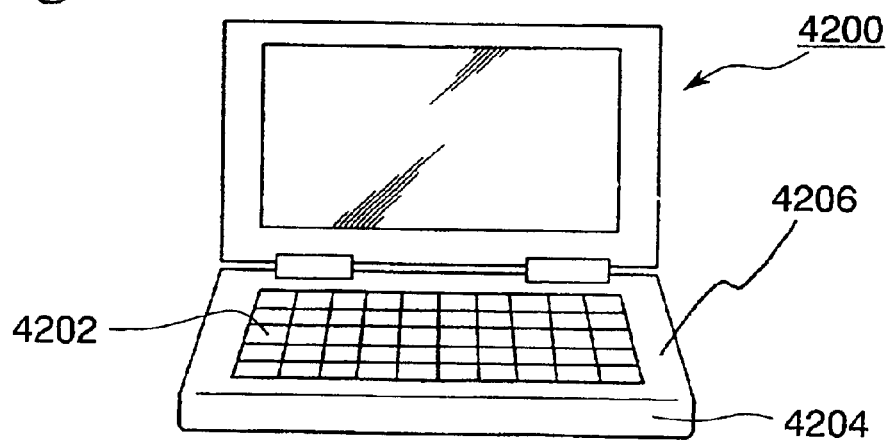

FIG. 8C is a perspective view showing an example of a portable data processing device such as a word processor, personal computer or the like. In FIG. 8C, the reference numeral 4200 indicates an information processing device, 4202 indicates the input portion such as a keyboard, and 4204 indicates the main body of the information processing device. Memory portion 4206 which employs the above-described ferroelectric memory is provided inside device 4200.

Although not shown in the drawings, as another example of an electronic device, the present invention can also be employed in so-called IC cards provided with a memory portion that employs the above-described ferroelectric memory in a card, for example.

The electronic apparatuses (including IC cards) shown in FIGS. 8A to 8C are provided with a ferroelectric memory having both integration and memory characteristics as described by the preceding embodiments. As a result, it is possible to realize electronic devices that are highly reliable, low in cost and small in size.

The technical scope of the present invention is not limited to the preceding embodiments. Rather, a variety of modifications may be applied, as long as the modification is within a scope that does not fall outside the essential feature of the present invention.

For example, the above-described ferroelectric memory can also be employed in a so-called 1T1C type memory cell formed of one MOS transistor and one capacitor, or a so-called 2T2C memory cell formed of two MOS transistors and two capacitors.

As described above, by means of the present invention, it is possible to produce a peripheral circuit chip and a memory cell array chip using processes suitable for each chip, in a ferroelectric memory that has a memory cell array in the form of a highly integrated matrix. As a result, an epitaxial ferroelectric layer in which the hysteresis curve has superior angularity can be assembled, making it possible to form a memory device with high performance and high yield. Moreover, by selecting a material such as glass or plastic for the mounting base, it is possible to reduce the cost of the memory device. Further, the present invention makes it possible to obtain an electronic apparatus that is highly reliable, inexpensive and small in size.

What is claimed is:

1. A ferroelectric memory comprising:
   a mounting base composed of any one of semiconductor, glasses, and plastics;
   a memory cell array disposed on the mounting base and layered as a memory cell array chip and including first signal electrodes and second signal electrodes which are disposed facing and perpendicular to each other, and a ferroelectric layer which is disposed between the first signal electrode and the second signal electrode, wherein regions of intersection between said first signal electrodes and said second signal electrodes that include said ferroelectric layer are in the form of a matrix for employment as memory cells;
   a peripheral circuit disposed on the mounting base and layered as a peripheral circuit chip and including MOS transistors for selecting the memory cells;
   wherein, in said memory cell array chip, said first signal electrodes undergo expitaxial growth on a (100) Si single crystal substrate via a buffer layer, the buffer layer including either a metal oxide MO (M=Mg, Ca, Sr, Ba) or a titanium nitride (TiN) having a NaCl structure;
   the first signal electrodes include either a conductive oxide having a perovskite structure (100)-oriented in a pseudo-cubic system or a metal platinum Pt that is (100)-oriented in a pseudo-cubic system; and
   said ferroelectric layer undergoes epitaxial growth on said first signal electrode, and the peripheral circuit and the memory cell array are formed on separate chips.

2. A ferroelectric memory according to claim 1, wherein said ferroelectric layer is composed of an oxidized ferroelectric material having a perovskite structure, or an oxidized ferroelectric material having a Bi layered perovskite structure.

3. A ferroelectric memory according to claim 1, wherein said ferroelectric layer has a polarization moment in the (001) tetragonal direction and is composed of an oxidized ferroelectric material having perovskite structure and being (100)-oriented.

4. A ferroelectric memory comprising:
   a mounting base composed of any one of semiconductor, glasses, and plastics;
   a memory cell array disposed on the mounting base and layered as a memory cell array chip and including first signal electrodes and second signal electrodes which are disposed facing and perpendicular to each other, and a ferroelectric layer which is disposed between the first signal electrode and the second signal electrode, wherein regions of intersection between said first signal electrodes and said second signal electrodes that include said ferroelectric layer are in the form of a matrix for employment as memory cells;

a peripheral circuit disposed on the mounting base and layered as a peripheral circuit chip and including MOS transistors for selecting the memory cells;

wherein, in said memory cell array chip, said first signal electrodes undergo expitaxial growth on a (110)-Si single crystal substrate via a buffer layer, the buffer layer including either a metal oxide MO (M=Mg, Ca, Sr, Ba) or a titanium nitride (TiN), wherein the metal oxide MO (M=Mg, Ca, Sr, Ba) and the titanium nitride (TiN) have an NaCl structure and (110)-oriented in a cubic system;

the first signal electrodes include either a conductive oxide having a perovskite structure (110)-oriented in a cubic system or (110)-oriented in a pseudo-cubic system, or a cubic aligned metal platinum Pt that is (110)-oriented; and said ferroelectric layer undergoes epitaxial growth on said first signal electrode, and the peripheral circuit and the memory cell array are formed on separate chips.

5. A ferroelectric memory according to claim 4, wherein said ferroelectric layer is composed of an oxidized ferroelectric material having a Bi layered perovskite structure that has a polarization moment in the a or b axis direction in a tetragonal or orthorhombic.

6. A ferroelectric memory comprising:

a mounting base composed of any one of semiconductor, glasses, and plastics;

a memory cell array disposed on the mounting base and layered as a memory cell array chip and including first signal electrodes and second signal electrodes which are disposed facing and perpendicular to each other, and a ferroelectric layer which is disposed between the first signal electrode and the second signal electrode, wherein regions of intersection between said first signal electrodes and said second signal electrodes that include said ferroelectric layer are in the form of a matrix for employment as memory cells;

a peripheral circuit disposed on the mounting base and layered as a peripheral circuit chip and including MOS transistors for selecting the memory cells;

wherein, in said memory cell array chip, said first signal electrodes undergo expitaxial growth on a (111)-Si single crystal substrate via a buffer layer, the buffer layer including either a metal oxide MO (M=Mg, Ca, Sr, Ba) which is (111)-oriented in a cubic system having a NaCl structure, or a titanium nitride (TiN);

the first signal electrodes include either a conductive oxide which is (111)-oriented in cubic system or (111)-oriented in a pseudo-cubic system having perovskite structure, or metal platinum Pt which is (111)-oriented in cubic system; and said ferroelectric layer undergoes epitaxial growth on said first signal electrode, and the peripheral circuit and the memory cell array are formed on separate chip.

7. A ferroelectric memory according to claim 6, wherein said ferroelectric layer is composed of an oxidized ferroelectric material having a polarization moment in the (111) rhombohedral direction and a (111)-oriented perovskite structure, or an oxidized ferroelectric material having a Bi layered perovskite structure which has a polarization moment in the a or b axis direction in a tetragonal or orthorhombic.

8. A ferroelectric memory comprising:

a mounting base composed of any one of semiconductor, glasses, and plastics;

a memory cell array disposed on the mounting base and layered as a memory cell array chip and including first signal electrodes and second signal electrodes which are disposed facing and perpendicular to each other, and a ferroelectric layer which is disposed between the first signal electrode and the second signal electrode, wherein regions of intersection between said first signal electrodes and said second signal electrodes that include said ferroelectric layer are in the form of a matrix for employment as memory cells;

a peripheral circuit disposed on the mounting base and layered as a peripheral circuit chip and including MOS transistors for selecting the memory cells;

wherein, in said memory cell array chip, said first signal electrodes undergo expitaxial growth on a (100)-Si single crystal substrate via a buffer layer, the buffer layer including either yttrium stabilized zirconia YSZ which is (100)-oriented in a cubic system having a fluorite structure, or a cerium oxide $CeO_2$;

the first signal electrodes include either a conductive oxide which is (110)-oriented in cubic system or (110)-oriented in a pseudo-cubic system having a perovskite structure, or a metal Pt which is (110)-oriented in cubic system; and said ferroelectric layer undergoes epitaxial growth on said first signal electrode, and the peripheral circuit and the memory cell array are formed on separate chip.

9. A ferroelectric memory according to claim 8, wherein said ferroelectric layer is composed of an oxidized ferroelectric material having a Bi layered perovskite structure which has a polarization moment in the a axis or the b axis direction in a tetragonal or orthorhombic.

10. An electronic apparatus characterized in the provision of a ferroelectric memory according to claim 1.

11. An electronic apparatus characterized in the provision of a ferroelectric memory according to claim 2.

12. An electronic apparatus characterized in the provision of a ferroelectric memory according to claim 3.

13. An electronic apparatus characterized in the provision of a ferroelectric memory according to claim 4.

14. An electronic apparatus characterized in the provision of a ferroelectric memory according to claim 5.

15. An electronic apparatus characterized in the provision of a ferroelectric memory according to claim 6.

16. An electronic apparatus characterized in the provision of a ferroelectric memory according to claim 7.

17. An electronic apparatus characterized in the provision of a ferroelectric memory according to claim 8.

18. An electronic apparatus characterized in the provision of a ferroelectric memory according to claim 9.

* * * * *

UNITED STATES PATENT AND TRADEMARK OFFICE
CERTIFICATE OF CORRECTION

PATENT NO. : 6,930,339 B2
APPLICATION NO. : 10/105002
DATED : August 16, 2005
INVENTOR(S) : Takamitsu Higuchi et al.

It is certified that error appears in the above-identified patent and that said Letters Patent is hereby corrected as shown below:

Title Page: * (Notice)     Insert -- Terminal Disclaimer filed 5/27/03 against US SN 10/105,002 --

Column 1, Line 8:          "sample" should be -- simple --

Signed and Sealed this

Twenty-second Day of August, 2006

JON W. DUDAS
*Director of the United States Patent and Trademark Office*